United States Patent
Leinbach (10) Patent No.: US 6,911,738 B2
(45) Date of Patent: Jun. 28, 2005

(54) METHOD AND APPARATUS FOR IMPROVING DEFECTIVE SOLDER JOINT DETECTION USING X-RAY INSPECTION OF PRINTED ASSEMBLIES

(75) Inventor: Glen E. Leinbach, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/694,104

(22) Filed: Oct. 27, 2003

(65) Prior Publication Data

US 2005/0087886 A1 Apr. 28, 2005

(51) Int. Cl.$^7$ ................................................ H01L 23/48
(52) U.S. Cl. ........................................................ 257/780
(58) Field of Search ........................... 374/5; 378/58; 439/68, 69, 70, 71, 72, 73; 257/780, 781, 778, 777, 786; 438/108, 612, 107, 613, 614, 615, 616

(56) References Cited

U.S. PATENT DOCUMENTS

| | | | |
|---|---|---|---|
| 5,886,409 A | * | 3/1999 | Ishino et al. |
| 2004/0026107 | * | 2/2004 | Caldwell et al. |

* cited by examiner

*Primary Examiner*—Nathan I. Flynn
*Assistant Examiner*—Kevin Quinto
(74) *Attorney, Agent, or Firm*—Cynthia S. Mitchell (57) ABSTRACT

An assembly and method for detecting defective and open solder joints of an area array packages attached to a printed circuit assembly is presented. The assembly employs offset pad layout on either or both of the printed circuit assembly or the area array package allowing improved solder joint defect detection.

6 Claims, 10 Drawing Sheets

METHOD AND APPARATUS FOR IMPROVING DEFECTIVE SOLDER JOINT DETECTION USING X-RAY INSPECTION OF PRINTED ASSEMBLIES

BACKGROUND OF THE INVENTION

Integrated circuits continue to be designed with increasing numbers of signal lines for higher performance and lower cost per square inch. In addition, larger numbers of power supply and ground lines are needed to ensure that the circuits function at higher speeds. Traditionally, the electrical and mechanical connections between the integrated circuit (IC) package and the printed circuit board (PCB) were made by soldering and have been peripheral to the package. Usually these connections were along two parallel sides or on all four sides of a square or rectangular IC package.

As the number of lines into and out of IC packages has increased, more leads have been placed in less space. The dual inline package of the 1970s and 1980s had a typical lead spacing (also known as pitch) of 2.54 mm (0.100 inch), and the leads were soldered into copper plated holes in the PCB. Surface mount technology (SMT), which became more common for PCB assembly by the electronics industry during the 1980s and 1990s, eliminated the plated through holes for circuit leads and began the trend toward more closely spaced leads. Some of the first SMTs had 1.27 mm (0.050 inch) pitch components and by the 2000s, pitches had moved to 0.5 mm (0.0197 inch) for quad flat packs (QFPs). Assembly process tolerances and PCB fabrication limitations have limited widespread commercial manufacturing of components with pitches much smaller than 0.5 mm (0.0197 inch).

By changing from peripheral leads to solder balls (or columns) placed in an array under the IC package, many more leads with a larger pitch than those of a comparable QFP could be put on an IC package of any particular size. Electrical circuit paths are also shorter on these array packages than on comparable QFPs, resulting in improved electrical performance of high-speed circuits.

The most common forms of these array packages are called plastic or ceramic ball grid arrays (PBGA, CBGA), ceramic column grid arrays (CCGA), and chip scale packages (CSP). The same technology is also used for directly attaching silicon IC's to the PCB or the package. This technology is called Flip Chip. Package material, solder ball pitch and composition, and the internal interconnection method of the integrated circuit to the package vary greatly, but all of these components can generally be called area array packages (AAP).

During assembly of the printed circuit assembly (PCA), the solder balls on the AAP are soldered to corresponding circuit pads on the surface of the PCB. Standard practice is to design the PCB so the pads on the PCB and the MP are aligned vertically with each other.

The number of solder joints on a typical PCA may range from hundreds to tens of thousands per assembly. Assurance that the solder joints have been made correctly is critical to the performance and reliability of the PCA. With peripherally leaded components, inspection of the solder joints is either done by manual or automated x-ray inspection (MXI or AXI). X-ray is particularly suited to solder joint inspection since the heavy elements in solder (e.g., tin, lead, bismuth, silver, indium, etc.) appear in high contrast to the rest of the PCA, which is typically made of lighter elements (copper, carbon, hydrogen, sodium, oxygen, etc.) This high contrast in the x-ray image allows determination of the structural quality of each solder joint, and therefore, its connectivity and probable level of reliability.

In most x-ray inspection systems, the x-rays penetrate the PCA perpendicularly or nearly perpendicularly from one side of the PCA. An image of the solder joints is formed on an x-ray detector on the other side of the PCA. This image of the solder joints is then analyzed either visually or automatically by a computer. The solder balls (or columns) used in area array packages typically have a larger diameter than the connection pad on the PCA. Most conventional visual inspection methods are quite limited on area array packages, since the solder joints are between the IC package and the PCA and are hidden from view. X-ray inspection is a practical way of Inspecting the solder joints of area array packages. Many defects are easily detected with x-ray inspection. For example, missing solder balls (or columns), solder bridges (or shorts) between balls (or columns), voids in the solder ball (or column), and misalignment of the package are all capable of being detected using x-ray inspection.

Due to the vertical nature of the area array solder joint, the area where the solder ball (or column) connects to the PCA is directly underneath the solder ball (or column). When making an x-ray image of this type of solder joint, it is relatively difficult to evaluate the quality of this critical connection between the solder ball (or column) and the PCB pad, since the shadow of the material in the solder ball (or column) blocks the x-rays. This shading limits effective x-ray inspection of area array solder joints for opens since the elements of the solder joint (PCA pad, solder ball (or column), and package pad) are typically coaxial and arranged vertically to the plane of the PCA.

Figure 1:
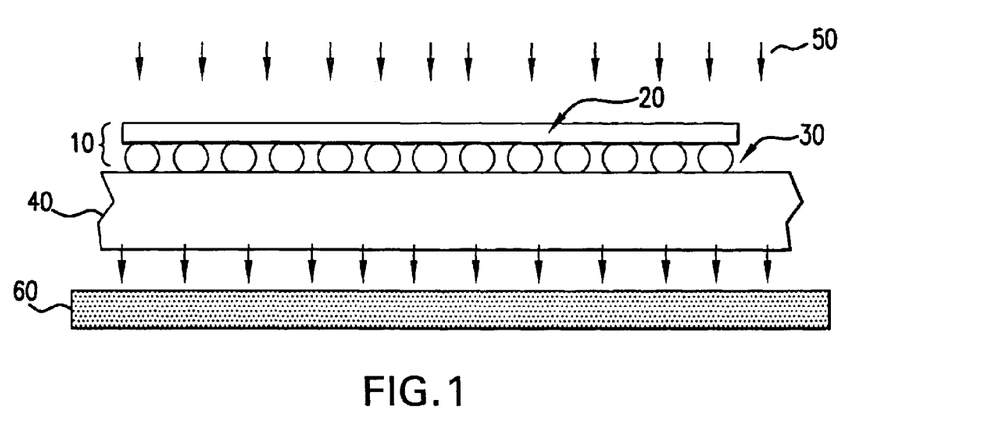
FIG. 1 Illustrates a typical area array package soldered to a printed circuit assembly.
Figure 2:
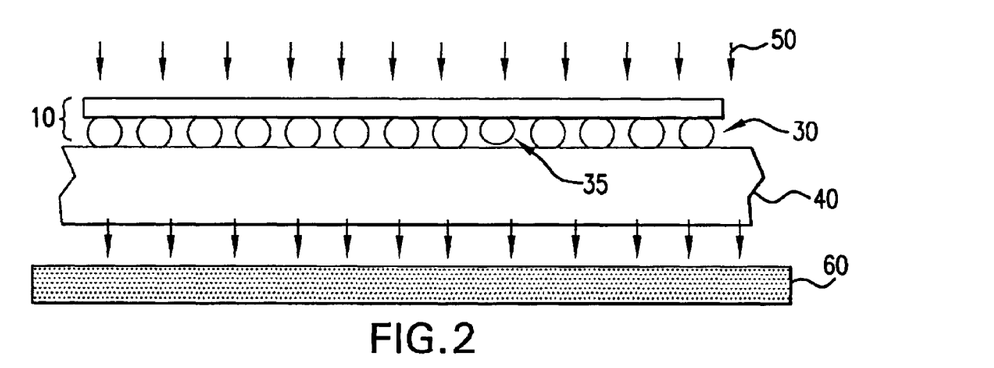
FIG. 2 illustrates a typical area array package soldered to a printed circuit assembly with a defective solder joint.
Figure 3:
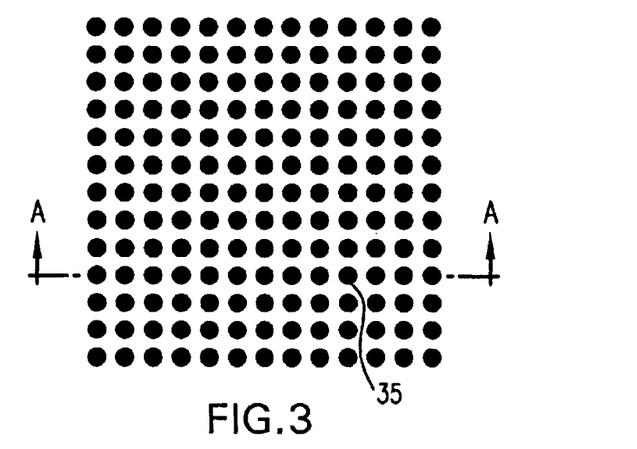
FIG. 3 illustrates an exemplary top view of an x-ray image of an area array package soldered to a printed circuit assembly.

FIG. 1 illustrates a typical ball grid array 10 with a substrate 20 and solder balls 30 soldered to a printed circuit board 40 during x-ray inspection, wherein x-rays 50 are transmitted through the ball grid array package 10 and printed circuit board 40 to an x-ray detector 60. FIG. 2 illustrates an example of a typical ball grid array package 10 with an open solder joint 35 at the interface with the printed circuit board 40. FIG. 3 is an exemplary illustration of a typical final x-ray image of a ball grid array package as in FIG. 2. As will be readily apparent, the open solder joint 35 can sometimes be indistinguishable from other acceptable solder joints in the ball grid array package and printed circuit board assembly, due to the shading caused by the solder in the solder ball.

Tilting the printed circuit board assembly in the x-ray inspection system to mitigate the effect of this shading is usually ineffective, since adjacent solder balls (or columns) cause similar shading problems. Because of this shading, open solder joints are difficult to detect with x-ray inspection.

On many open solder joints on area array packages, solder that would typically be part of the connection with the printed circuit board pulls away from the printed circuit board and merges with the solder in the ball on the package. This results in a ball with a slightly larger diameter than that of acceptable solder joints. One method of automatic x-ray inspection that measures these diameters and compares them statistically to detect open solder joints is described In U.S. patent application Ser. No. 10/024,101, entitled "System and Method for Identifying Solder Joint Defects" by Tracy K. Ragland, which is hereby incorporated by reference.

This automatic inspection and statistical comparison technique is effective for detecting many opens, but has limited effectiveness on area array packages with solder balls (or columns) that are designed not to melt during the soldering process. In addition, the visual appearance of open and acceptable solder joints on the x-ray image being analyzed is almost indistinguishable, making confirmation of defects by a repair operator rather difficult. This technique is also susceptible to variations of solder ball diameters not caused by opens, such as voids and variation in the amount of solder used in the joints on the printed circuit board. These variations can cause incorrect indictment of acceptable solder joints or false acceptance of bad solder joints, reducing the credibility of this method in production manufacturing environments.

Some manufacturers have used oval pads on the printed circuit boards to enhance detection of opens, since part of the oval pad extends beyond the shadow of the solder ball (or column), which permits the x-ray inspection system to generate images of part of the printed circuit board pad. Like conventional round pads, the center of these oval pads is coaxial with the solder ball (or column) and package pad. Open solder joints tend to have a different appearance in the x-ray image than acceptable solder joints when oval pads are used.

Figure 4:
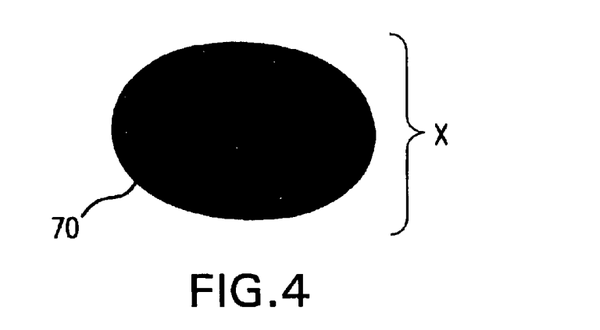
FIG. 4 illustrates an exemplary top view of an x-ray image of an acceptable solder joint utilizing an oval bonding pad.
Figure 5:
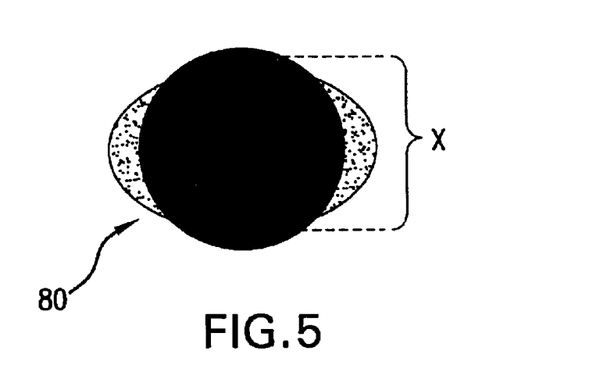
FIG. 5 illustrates an exemplary top view of an x-ray image of a defective solder joint utilizing an oval bonding pad.

FIG. 4 shows an exemplary x-ray image of an acceptable solder joint 70 with an oval pad. The acceptable solder joint appears uniformly dark due to thick solder shading the oval pad and the diameter of the solder ball equals X. FIG. 5 illustrates an exemplary x-ray image of an open solder joint 80 on an oval pad. The typical open solder joint on the oval pad appears lighter on the outer edges of the pad due to minimal solder remaining on the printed circuit board and the diameter of the solder ball is typically larger than X. As will be evident from FIGS. 4 and 5, the oval shape pads cause solder balls to form oval shaped solder joints 70 when the pad is properly bonded by the solder. And, conversely, the oval shaped pads permit detection of open solder joints as the associated solder image 80 remains somewhat circular.

Figure 6:
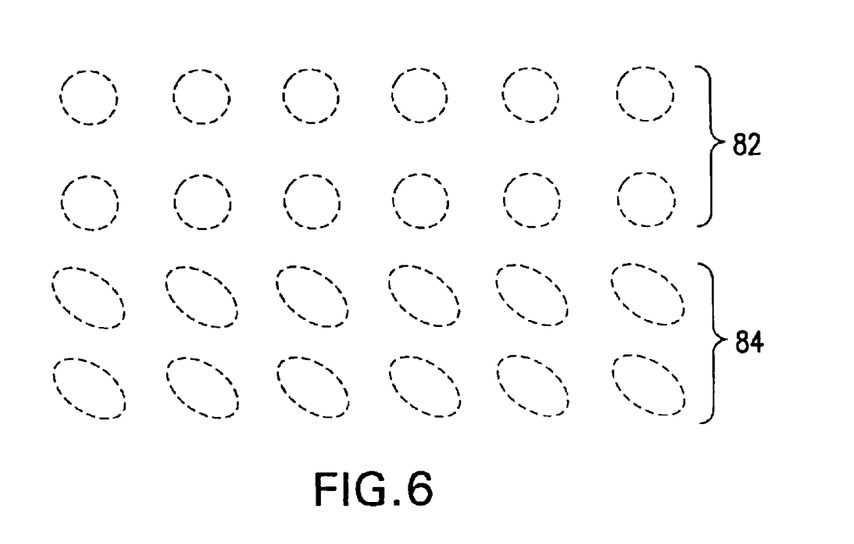
FIG. 6 illustrates a top view of round bonding pads and oval bonding pads.
Figure 7:
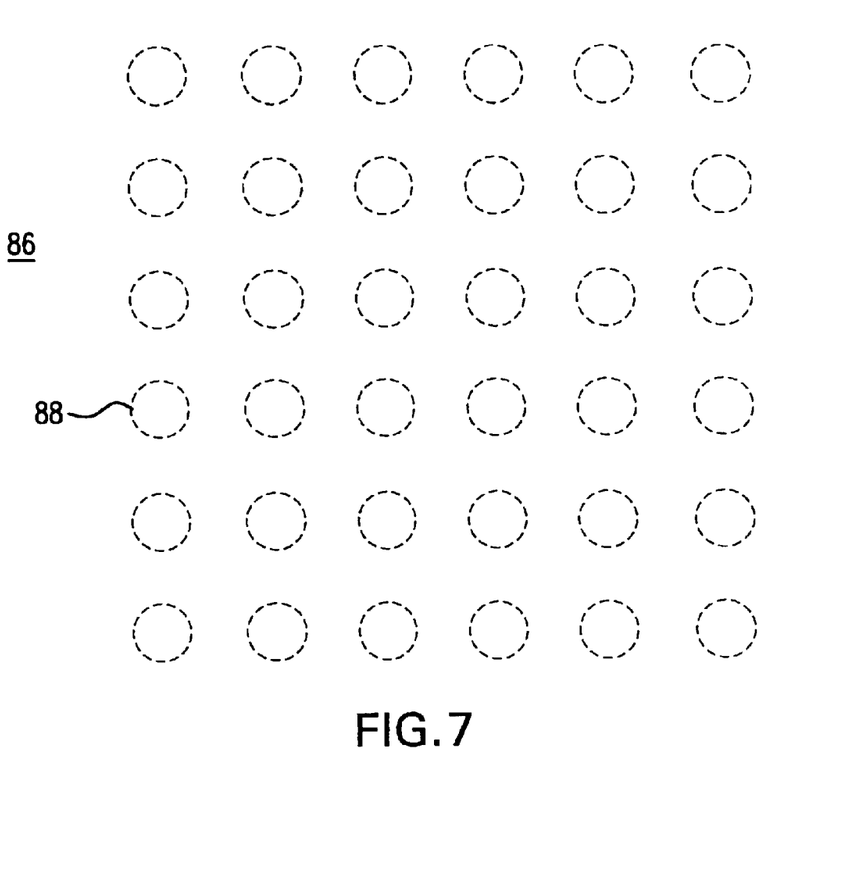
FIG. 7 illustrates a top view of a small section of a typical round pad grid layout pattern of an AAP or a PCA.
Figure 8:
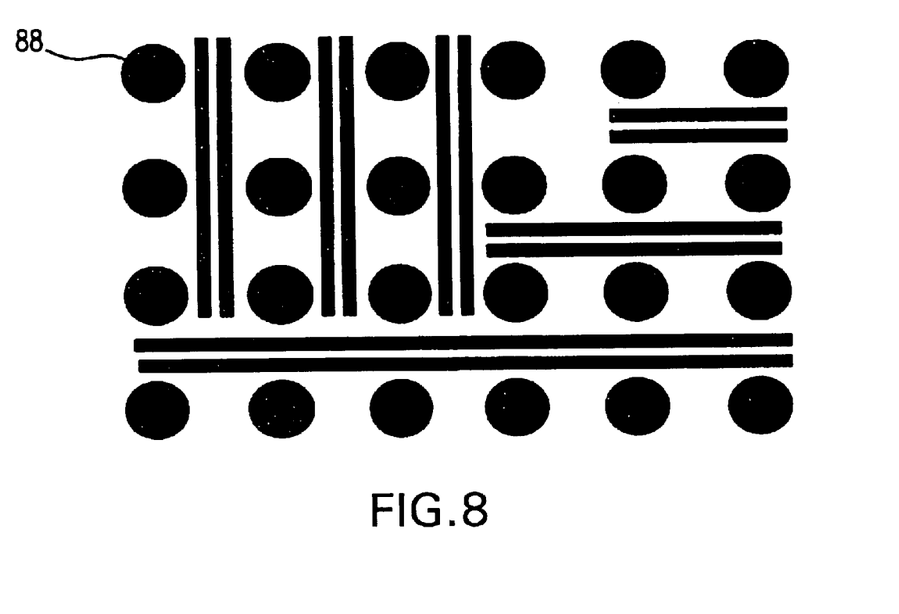
FIG. 8 illustrates a top view of a small section of a typical PCA showing a typical grid pad pattern with trace routing layout.

However, as seen in FIG. 6, oval pads 84 cover more area on the surface of the printed circuit board than conventional round pads 82, resulting in difficulties in routing traces to the pads. FIG. 7 illustrates a small section of 36 pads of a typical round grid pad layout 86 on a printed circuit board or area array package. It is noted that the spacing of the pads 88 is regular for both rows and columns. FIG. 8 is an exemplary illustration of a typical trace routing layout with round pads 88 on a typical round grid pad layout 86 on a printed circuit board or area array package. It is observed that similar trace routing would be limited using oval pads 84.

Despite the improvement in detecting solder joints in area array packages utilizing oval pads, it would be desirable to have an improved system and method for improving the accuracy of solder joint inspection systems to accurately identify defective solder joints used to physically and electrically connect various printed circuit devices on printed circuit board while leaving more space available on the printed circuit board or area array package for trace routing layout.

SUMMARY OF THE INVENTION

In response to these and other shortcomings of the prior art, a solder joint inspection system and method for identifying solder joint defects are disclosed.

In one arrangement, the system may be viewed as providing a method for identifying solder joint defects in a printed circuit assembly with area array packages attached thereto. In this regard, this method may be summarized by employing an offset pad layout on either or both of the printed circuit assembly or on the area array package attached to the printed circuit assembly.

Other systems, methods and features associated with detecting solder joint defects in accordance with the invention will become apparent to one skilled in the art upon examination of the following drawings and description. It is intended that all such additional systems, methods and features included within this description are within the scope of the systems and methods for identifying solder joint defects as described in the accompanying claims.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

The present invention provides systems and methods, which address the above listed problems. Particularly important is that an improved solder-joint inspection system configured to use offset pads may significantly reduce the number of false "defects" identified upon analyzing one or more measurements of each Individual solder joint. An improved solder-joint inspection system configured in accordance with the offset pads accounts for acceptable trace routing area on the printed circuit board and area array package.

To facilitate description of the system and methods, an exemplar system is discussed with reference to the figures. The exemplar system and associated methods are provided for purposes of illustration only. Various modifications are feasible without departing from the inventive concept.

For example, the exemplar data, figures, and related description are focused on diameter measurements associated with solder joints affixed to BGA packages. Those skilled in the art will appreciate that variation occurs in other solder joint types (i.e., non-spherical joints). Consequently, the method for offset pads will be applicable to various other solder joint types.

In accordance with preferred embodiments, a commercially available solder-joint inspection system, such as the 5DX X-ray Inspection System available from Agilent Technologies of Palo Alto, Calif, records location information regarding a plurality of pins (i.e., solder-joint interfaces) on each printed circuit device of a printed circuit assembly (i.e., a device populated printed circuit board). Using the location information, the solder-joint inspection system associates each of the plurality of pins with a set of neighbor pins (i.e., adjacent pins) on each respective printed circuit device. After recording at least one actual measurement of a characteristic of each solder joint under inspection, the solder-joint inspection system generates an expected pass/fail criteria for each measurement associated with each respective solder joint that accounts for acceptable (i.e., low-frequency) variation in the actual measurement values recorded. Exemplar characteristics of a solder joint that may be measured may include thickness, shape, heel height, solder volume, among others.

Figure 9:
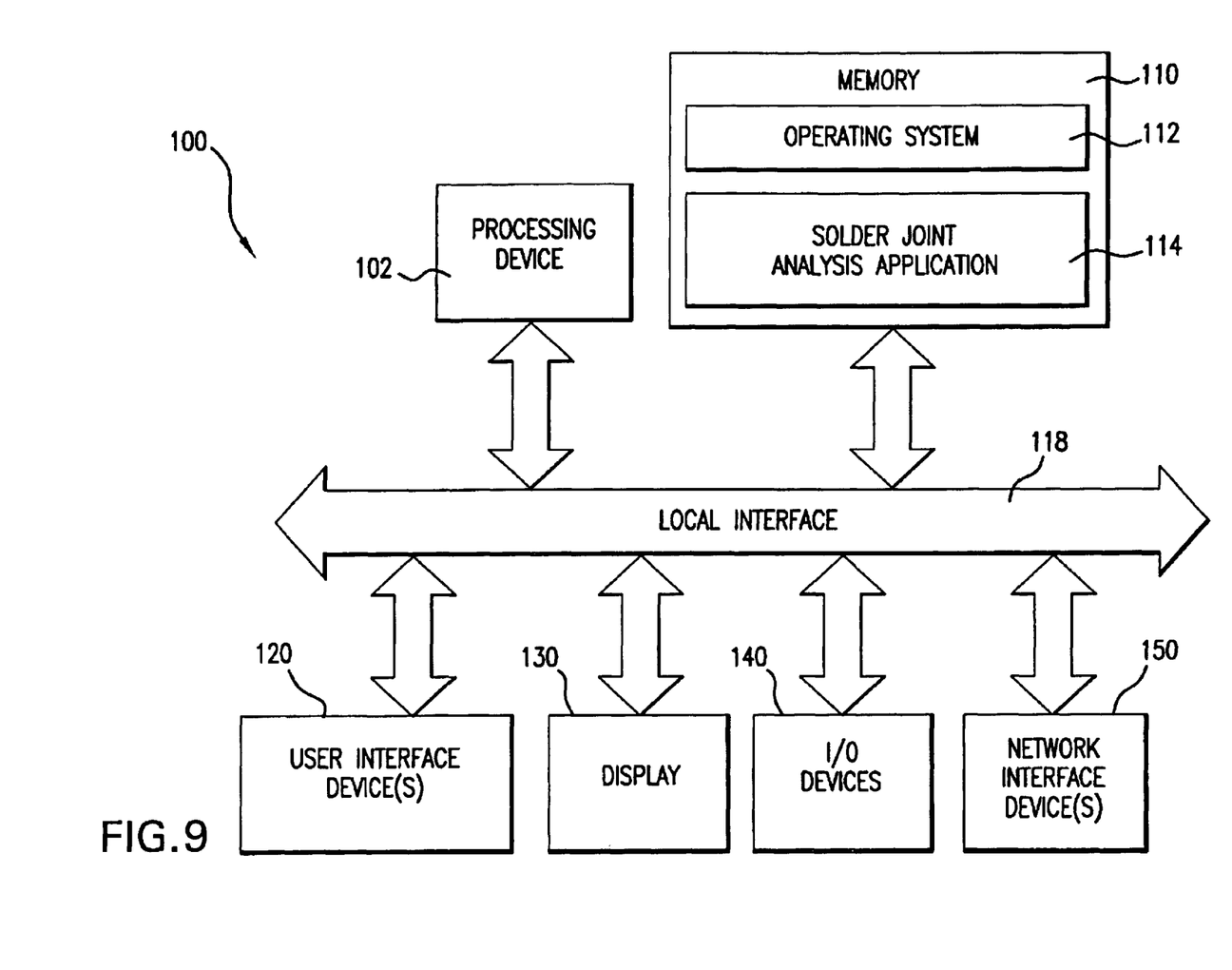
FIG. 9 illustrates a functional block diagram of an exemplar x-ray solder joint inspection system.

Referring now to FIG. 9, illustrated is a functional block diagram showing various components within an exemplar solder-joint inspection system 100. Generally, FIG. 9 is a schematic illustrating the various functional building blocks of a computer-based solder-joint inspection system, which can apply the various methods for identifying solder-joint defects. Generally, the solder-joint inspection system 100 can comprise any one of a wide variety of wired and/or wireless computing devices, such as a desktop computer, a portable computer, a dedicated server computer, a multi-processor computing device, among others. Irrespective of its specific arrangement, the solder-joint inspection system 100 can, for instance, comprise a processing device 102, memory 110, one or more user interface devices 120, a display 130, one or more input/output (I/O) devices 140, and one or more network interface devices 150, each of which is connected via a local interface 118.

The processing device 102 can include any custom made or commercially available processor, a central processing unit (CPU) or an auxiliary processor among several processors associated with the solder-joint inspection system 100, a semiconductor based microprocessor (in the form of a microchip), a macro-processor, one or more application-specific Integrated circuits (ASICs), a plurality of suitably configured digital logic gates, and other well known electrical configurations comprising discrete elements both individually and in various combinations to coordinate the overall operation of the solder-joint inspection system 100.

The memory 110 can include any one of a combination of volatile memory elements (e.g., random access memory (RAM, such as DRAM, SRAM, etc.)) and non-volatile memory elements (e.g., ROM, hard drive, tape, CDROM, etc.). The memory 110 typically comprises an O/S 112, one or more applications such as a solder-joint analysis application 114. Persons having ordinary skill In the art will appreciate that the memory 110 can, and typically will, comprise other components, which have been omitted for purposes of brevity. These may include a host of programs configured to control various aspects of the solder-joint inspection mechanisms.

The one or more user interface devices 120 comprise those components with which the user can interact with the solder-joint inspection system 100. For example, where the solder-joint inspection system 100 comprises a personal computer (PC), these components can comprise a keyboard and mouse. Where the solder-joint inspection system 100 is expected to be used in extreme environments (e.g., near a solder flow machine), these components can comprise function keys or buttons, a touch-sensitive screen, a stylus, etc. The display 130 can comprise a computer monitor or plasma screen for a PC or alternatively a liquid crystal display (LCD) as may be desired.

With further reference to FIG. 9, the one or more I/O devices 140 are adapted to facilitate connection of the solder-joint inspection system 100 to another system and/or device and may therefore include one or more serial, parallel, small computer system interface (SCSI), universal serial bus (USB), IEEE 1394 (e.g., Firewire™), and/or other interface components that may be used to communicatively couple the solder-joint inspection system 100 with one or more remote data storage devices for recording test measurement results. The network interface devices 150 comprise the various components used to transmit and/or receive data over a network. By way of example, the network interface devices 150 may include a device that can communicate both inputs and outputs, for instance, a modulator/demodulator (e.g., a modem), wireless (e.g., a radio-frequency (RF)) transceiver, a telephonic interface, a bridge, a router, a network card, etc.

Various software and/or firmware may be used to manage, coordinate, measure, record, estimate and compare expected values with measured values to generate error values, as well as to perform an outlier analysis on the generated error values, among other functions. The related software and/or firmware responsible for theses and other functions associated with the use of the underlying solderjoint inspection system 100 can be stored on any computer-readable medium for use by or in connection with any computer-related system or method. In the context of this document, a computer-readable medium denotes an electronic, magnetic, optical, or other physical device or means that can contain or store a computer program for use by or in connection with a computer-related system or method. These programs can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device.

The computer-readable medium can be, for example but not limited to, an electronic, magnetic, optical, electromagnetic, infrared, or semiconductor system, apparatus, device, or propagation medium. More specific examples (a nonexhaustive list) of the computer-readable medium include an electrical connection having one or more wires, a portable computer diskette, a random access memory (RAM), a read-only memory (ROM), an erasable programmable read-only memory (EPROM), an electrically erasable programmable read-only memory (EEPROM), or Flash memory, an optical fiber, and a portable compact disc read-only memory (CDROM). Note that the computer-readable medium can even be paper or another suitable medium upon which a program is printed, as the program can be electronically captured, via for instance, optical scanning of the paper or other medium, then compiled, interpreted or otherwise processed in a suitable manner as necessary, and then stored in a computer memory.

Figure 10:
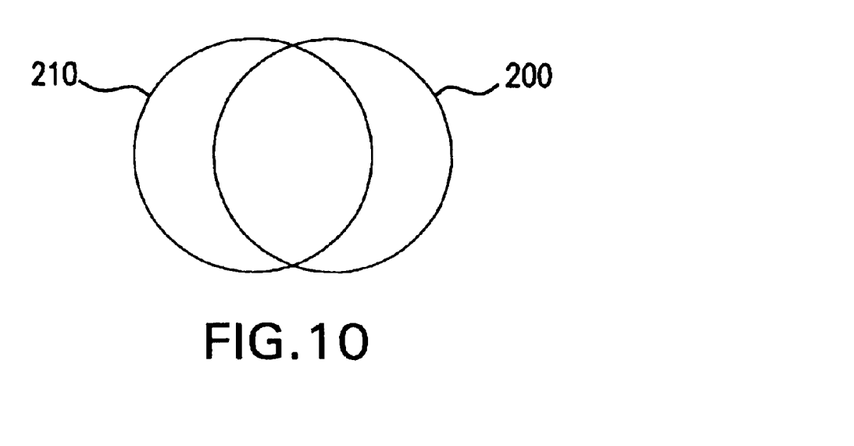
FIG. 10 illustrates top view of a ball grid array package bonding pad and an offset printed circuit board pad.
Figure 11:
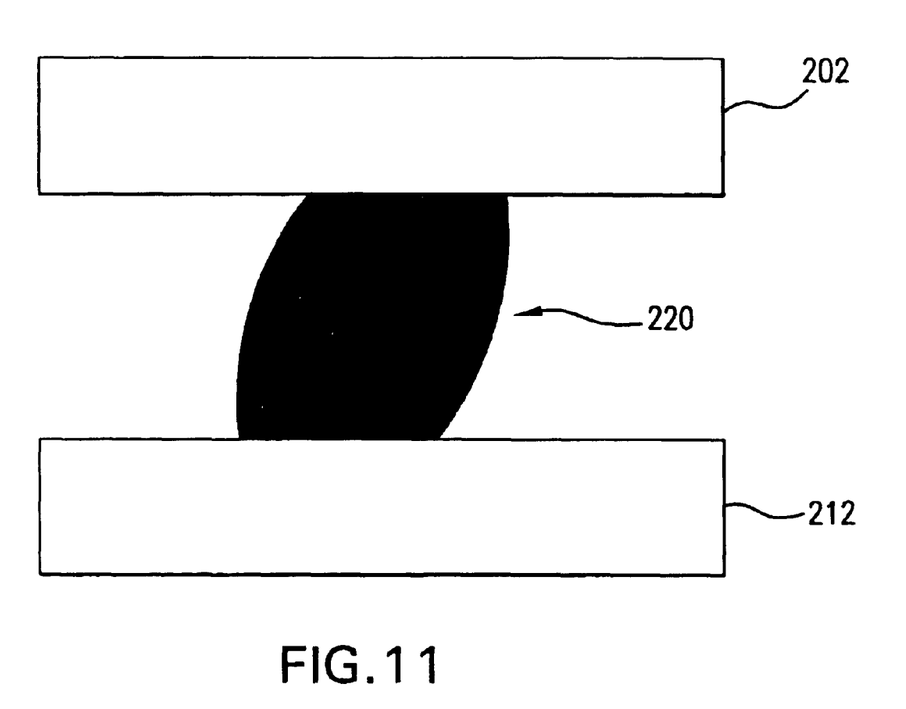
FIG. 11 illustrates a side view of an offset solder joint.

FIG. 10 illustrates a top view of corresponding ball grid array package bonding pad 200 and a printed circuit board pad 210 that are offset from each other. FIG. 11 illustrates a cross-section side view of an acceptable solder joint 212 between an ball grid array package or area array package 202 ball and an offset printed circuit board assembly 212 pad. By offsetting the printed circuit board pad 210 from the ball grid array or area array package ball, vertical or near vertical x-rays will create useful x-ray Images for analysis, with an obvious difference between acceptable and open joints.

Figure 12:
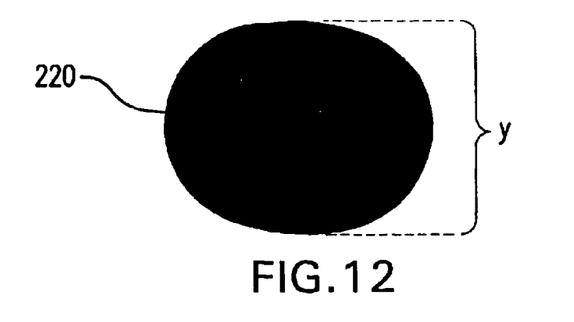
FIG. 12 illustrates a top view of an x-ray image of an acceptable offset solder joint.

FIG. 12 illustrates a top x-ray image view of an acceptable solder joint 220 between a ball grid array package ball or area array package ball 200 and an offset printed circuit board assembly pad 210. As seen in FIG. 12, an acceptable solder joint image shows a uniformly dark solder joint due to the thick solder shading of both BGA and PCA pads and the diameter of the solder joint equals Y.

Figure 13:
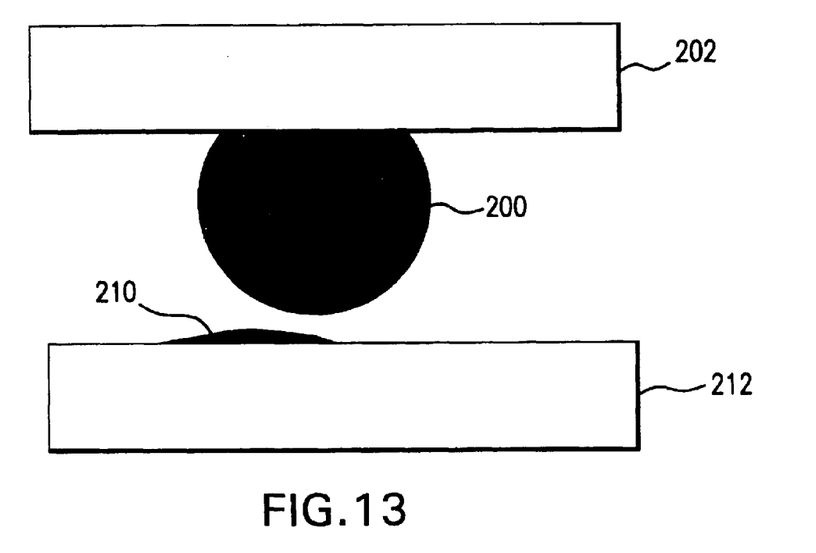
FIG. 13 illustrates a side view of an open offset solder joint.
Figure 14:
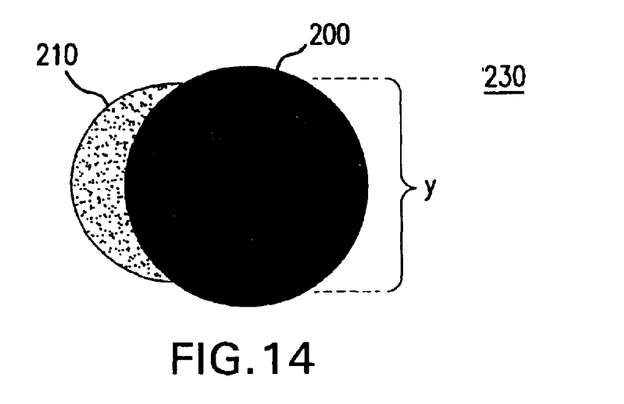
FIG. 14 illustrates a top view of an x-ray image of a defective offset solder joint.

FIG. 13 illustrates a cross-section side view of an open solder joint between a ball grid array 202 ball pad 200 and an offset pad 210 on a printed circuit board 212. If the solder joint does not form correctly and makes an open joint, the resulting x-ray image is as shown in FIG. 14, which is a top view of an open solder joint 230 between a ball grid array package ball pad 200 and an offset printed circuit board pad 210. As seen in FIG. 14, the printed circuit board pad 210 appears lighter due to minimal solder left on the printed circuit board pad 210, the diameter of the open solder joint is larger than Y, and the center of the open solder joint is concentric with the original ball grid array ball pad 200.

If all of the pads on the printed circuit board assembly are offset in the same direction as their corresponding pads on the area array package, the forces of surface tension during the soldering process will realign the area array package and the printed circuit board array pad, solder ball, and package pad will all be vertically aligned. This defeats the purpose of offsetting the pads.

Therefore, small sub groupings of pads on either the printed circuit board assembly or the area array package may be offset along a line toward the center of the group, making a smaller pattern. This small pattern is repeated as needed until all of the pads on either the printed circuit board or the area array package have offset pads. The forces of surface tension will be equalized for each small group of pads, so the entire component will not realign during the soldering process and negate the desired effect of the offset pads.

Figure 15:
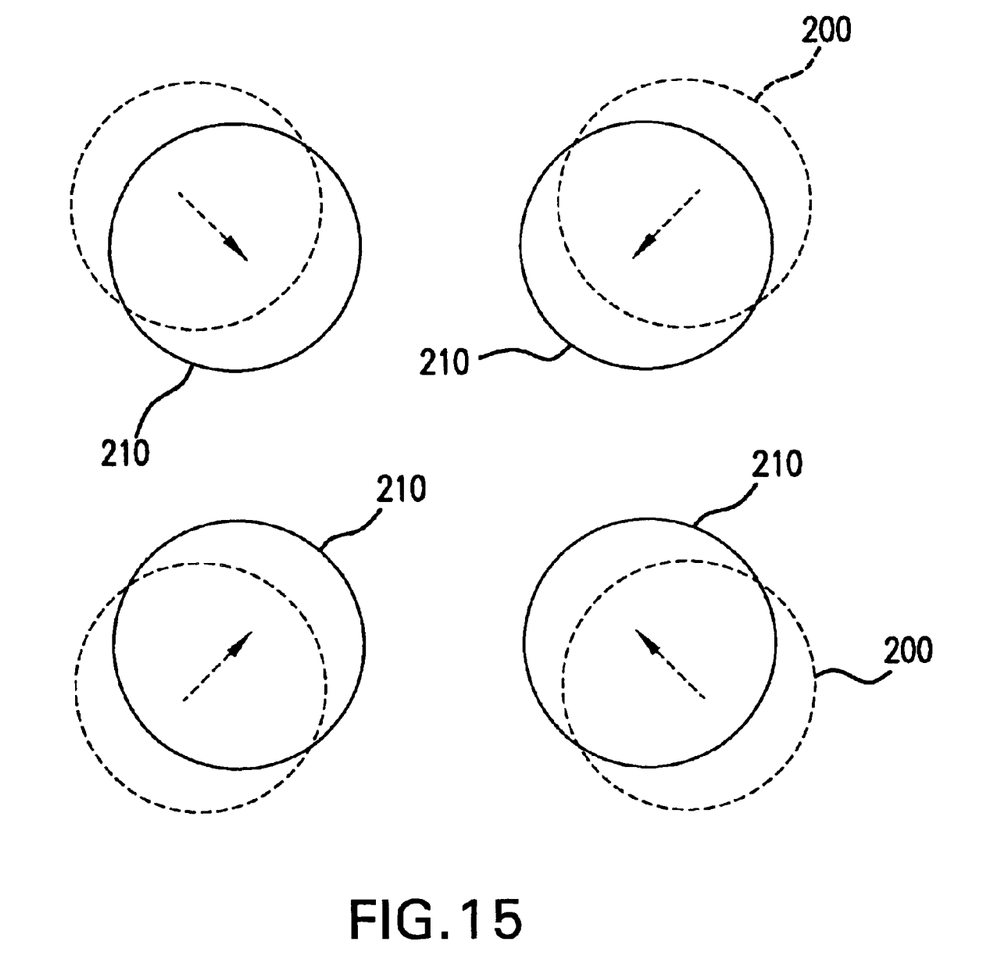
FIG. 15 illustrates a top view of a small group of area array package bonding pads overlaid a corresponding group of offset printed circuit assembly bonding pads.

One exemplary embodiment is shown FIG. 15, in which four pads 210 (solid lines) forming a square on a printed circuit assembly are offset toward each other. The corresponding pads 200 (dashed lines) on the area array package remain on a regular grid pattern.

As noted above, there are two ways of implementing the use of offset groups. The pads on the area array package may be offset in symmetrical groups (groups of four are shown for simplicity) for use with conventional, regularly spaced pads on a printed circuit assembly. Alternatively, the pads on the printed circuit assembly may be offset in symmetrical groups, allowing conventional design rules and processes for design of the area array package. Which option is ultimately selected by designers will most likely be governed by IC and PCB design rules, space constraints, costs, routing requirements, packaging, manufacturing, test and other design criteria.

Figure 16:
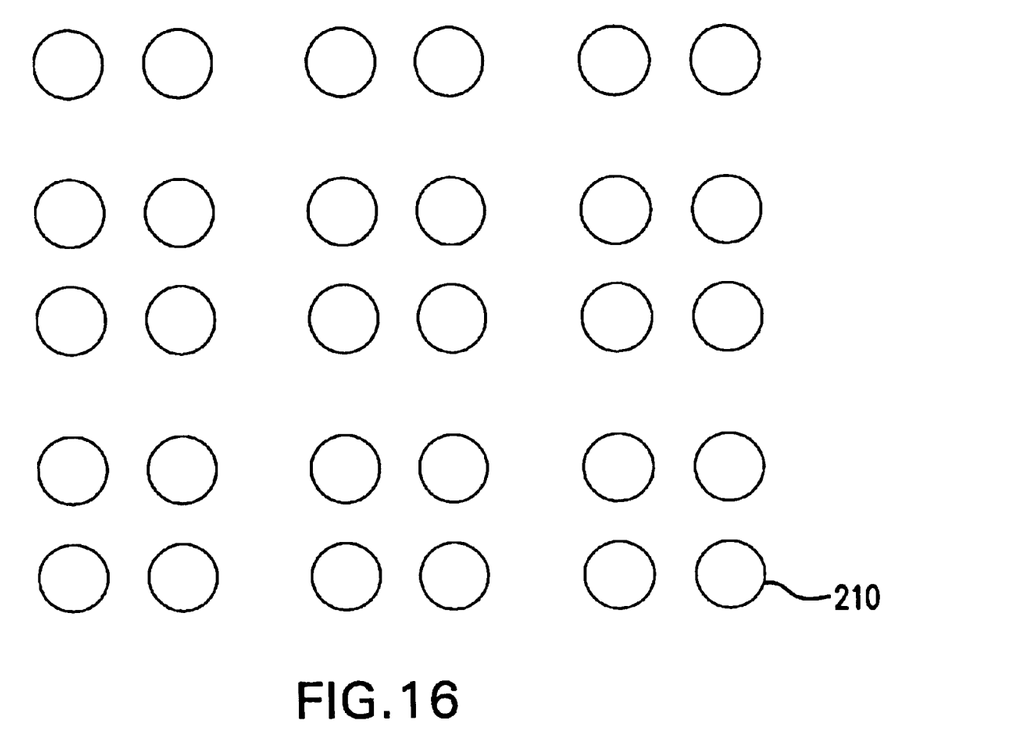
FIG. 16 illustrates a top view of a small section of offset printed circuit assembly bonding pads.
Figure 17:
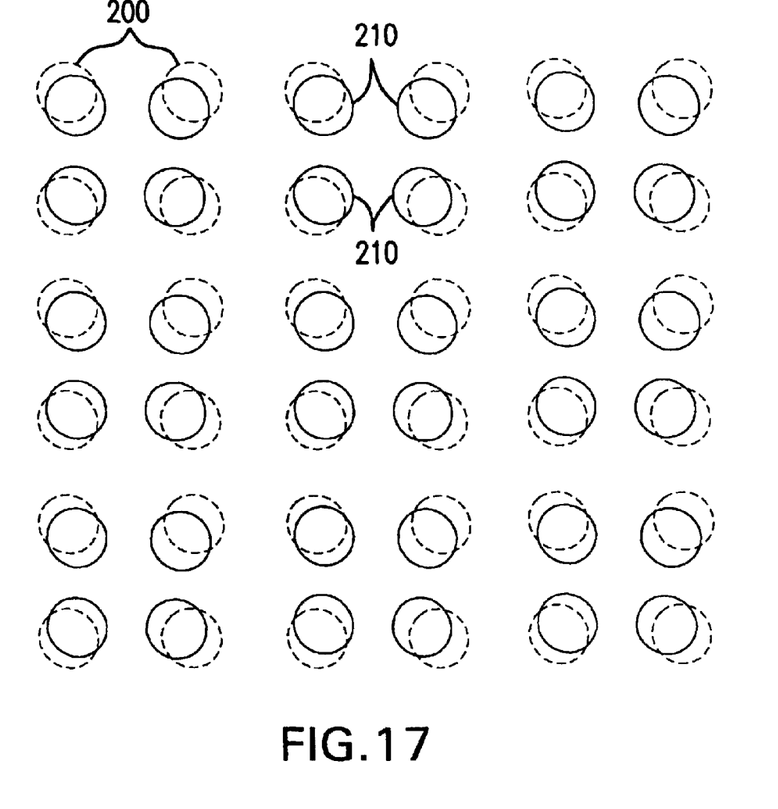
FIG. 17 illustrates a top view of a small section of area array package bonding pads overlaid a corresponding section of offset printed circuit assembly bonding pads.

FIG. 16 illustrates a small sectional top view of corresponding area array package or printed circuit assembly pads according to the invention. It is noted that each group of four pads 210 Is offset toward the center of those four pads. FIG. 17 illustrates a small sectional top view of an area array package ball pads 200 (dashed lines) having regular grid spacing overlaid corresponding printed circuit assembly pads 210 (solid lines) having an offset pad layout.

By using the same size round pads as conventional pad layouts, the same amount of printed circuit assembly area is available for routing traces, thus avoiding the layout design penalty incurred with the use of oval pads. If the amount of offset is equal to the width of one circuit trace and one space, the same number of traces can be routed, as would be the case in a conventional design. The pads should be offset enough so that the offset is detectable In the x-ray image, but not so much as to prevent the solder joint from being formed. For example, the pads may be offset approximately 10–30% of the nominal pitch in both the X and Y direction.

Figure 18:
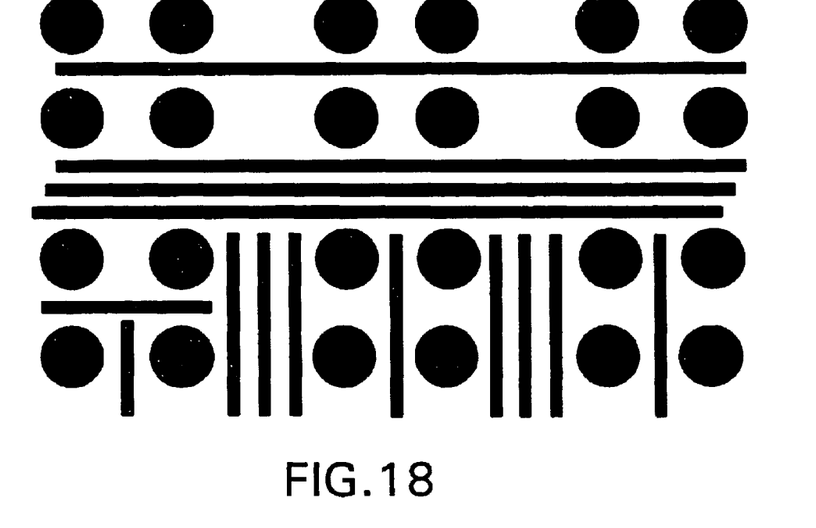
FIG. 18 illustrates a top view of a small section of offset printed circuit assembly bonding pads with exemplary trace routing.

FIG. 18 illustrates an example of possible trace routing layout with groups of 4 offset pads toward each other as illustrated in FIGS. 15–17. The pads are offset enough to permit one additional trace and space pair on one side of each row or column while reducing the number of trace and space pairs one the adjacent rows and columns by one.

As will be evident from the above description, drawings and accompanying claims, the present invention permits x-ray inspection of solder joint defects without compromising electrical performance and circuit trace routing line surface area on the printed circuit assembly or area array packages.

Figure 19:
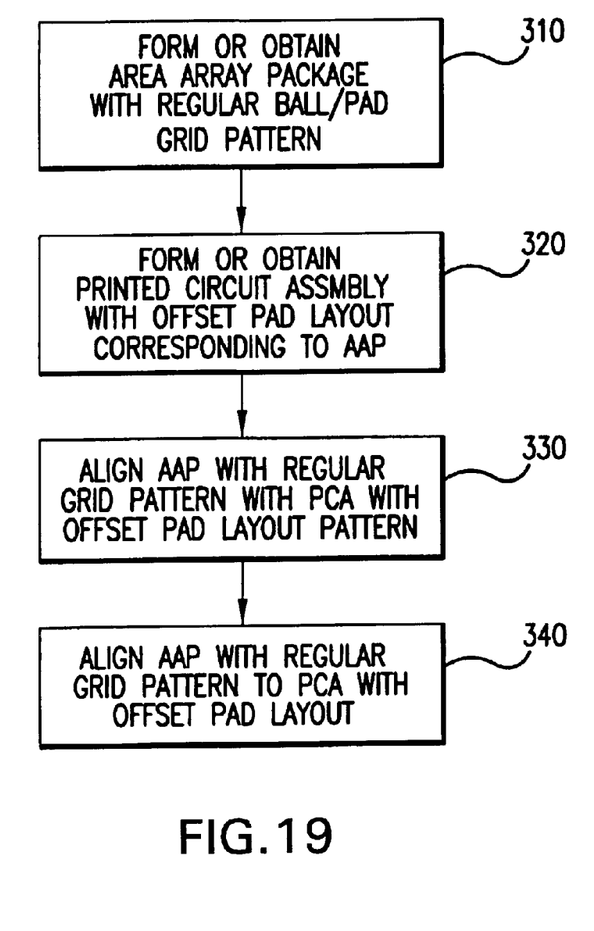
FIG. 19 is a flow diagram that illustrates a method for attaching an area array package to a printed circuit assembly with offset bonding pads.

FIG. 19 is a flow diagram that illustrates a method for attaching an area array package with a regular grid pattern to a printed circuit assembly with an offset pad pattern in accordance with one embodiment of the present invention. An area array package with a regular grid pattern may be assembled, purchased or otherwise obtained 310. A printed circuit assembly with an offset pad layout corresponding to the pad layout of the area array package may be assembled, purchased or otherwise obtained 320. The area array package is aligned with the offset pads on the printed circuit assembly 330. The area array package is soldered, bonded or attached by any known means to the printed circuit assembly with offset pads 340. It will be readily appreciated by those skilled in the art, that the printed circuit assembly may have a regular pad grid pattern and the area array package may contain an offset pad pattern relative to the printed circuit assembly as design choices and constraints allow. It will also be appreciated that these steps may be performed in orders other than that disclosed here for exemplary purposes. For example, step 320 may occur before step 310.

Figure 20:
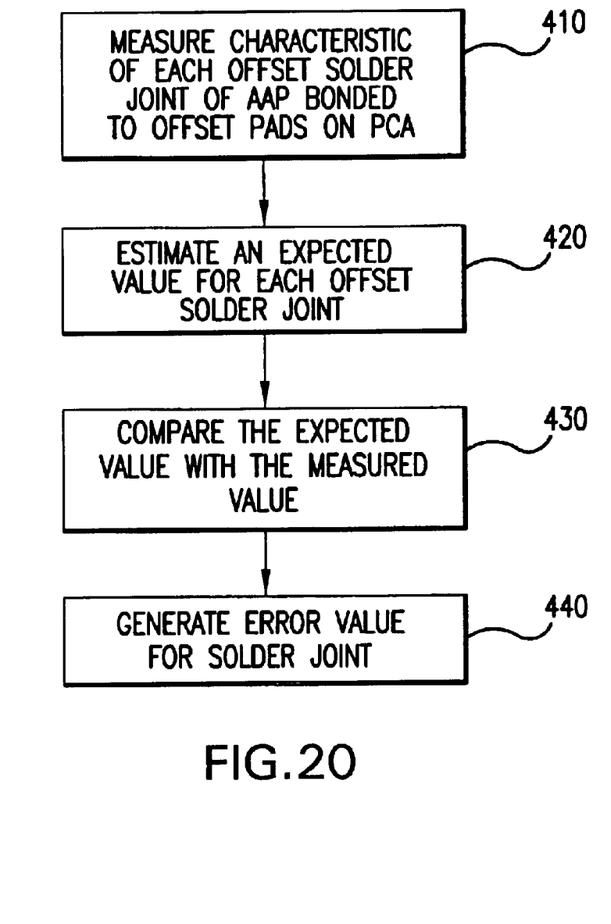
FIG. 20 is a flow diagram that illustrates a method for detecting defective solder joints of a printed circuit assembly with offset bonding pads.

FIG. 20 is a flow diagram that illustrates a method for performing x-ray inspection for detecting solder joint defects on an offset printed circuit assembly with area array packages according to the present invention. One may measure one or more desired characteristics of each offset solder joint of the area array package attached to the printed circuit assembly, for example, the width or diameter of the solder joint 410. One may obtain or estimate an expected value for an acceptable offset solder joint characteristic 420. The expected value of an acceptable solder joint and the measured value of an offset solder joint may be compared 430. An error value for the offset solder joint may be generated 440, in order to identify whether the particular solder joint is acceptable or defective. It will be appreciated that these steps may be performed in other orders, for example, step 420 may be performed before step 410.

Although this preferred embodiment of the present invention has been disclosed for illustrative purposes, those skilled in the art will appreciate that various modifications, additions and substitutions are possible, without departing from the scope and spirit of the invention, resulting in equivalent embodiments that remain within the scope of the appended claims. For example, the pad offset may be done on either or both of the printed circuit assembly or the area array package pads. Also, the small pad groupings for offsetting may be done in groups other than 4 pads each. The amount and direction of offset may vary depending on the design, reliability, trace routing, interference, electrical, mechanical, cost, or other requirements of a particular design.

What is claimed is:

1. An assembly, comprising:

a printed circuit assembly with a pad layout pattern; and an area array package with a pad layout pattern attached to the printed circuit assembly; wherein at least one of the pad layout of the printed circuit assembly or the pad layout of the area array package has an offset pad layout relative to the other pad layout, wherein said pad layout of the area array package is in a regular grid pattern, wherein said pad layout of the printed circuit assembly is offset with regularly spaced small groupings of pads corresponding to the pads to be bonded on the area array package.

2. An assembly in accordance with claim 1, wherein the regularly spaced small groupings of pads on the printed circuit assembly comprise four pads offset toward each other dispersed on the printed circuit assembly to correspond with the pads to be bonded on the area array package.

3. A method for manufacturing an assembly comprising:

obtaining an area array package having a pad layout pattern;

obtaining a printed circuit assembly having a pad layout pattern corresponding to the pad layout pattern of the area array package;

and attaching the area array package pad layout pattern to the printed circuit assembly pad layout pattern, wherein at least one pad layout pattern is a regular grid pattern and the other pad layout pattern is offset relative to the regular grid pattern, wherein said pad layout of the printed circuit assembly is offset with regularly spaced small groupings of pads corresponding to the pads to be bonded on the area array package.

4. A method for detecting offset solder joint defects between solder pads on an area array package attached to offset solder pads on a printed circuit assembly, comprising the steps of:

measuring a characteristic of an offset solder joint;

determining a value for an acceptable offset solder joint; and comparing the measured offset solder joint characteristic value with the acceptable offset solder joint characteristic value.

5. A method in accordance with claim 4, further comprising the step of:

generating an error value for the solder joint.

6. A method in accordance with claim 5, further comprising the step of:

determining if the solder joint is defective.

* * * * *